United States Patent [19]

Adams et al.

[11] 4,341,818

[45] Jul. 27, 1982

[54] METHOD FOR PRODUCING SILICON DIOXIDE/POLYCRYSTALLINE SILICON INTERFACES

[75] Inventors: Arthur C. Adams; Hyman J. Levinstein, both of Berkeley Heights, N.J.

[73] Assignee: Bell Telephone Laboratories, Incorporated, Murray Hill, N.J.

[21] Appl. No.: 159,865

[22] Filed: Jun. 16, 1980

[51] Int. Cl.$^3$ ............................................. B05D 5/12
[52] U.S. Cl. ...................................... 427/85; 427/93; 427/255.4; 427/255.7; 427/255; 427/248.1; 427/300; 427/350; 427/377
[58] Field of Search ............ 427/93, 85, 255.4, 255.7, 427/255, 248.1, 300, 350, 377

[56] References Cited
U.S. PATENT DOCUMENTS

| | | | |
|---|---|---|---|
| 3,900,660 | 8/1975 | Bradley | 427/255.1 |
| 3,903,325 | 9/1975 | Horiuchi | 427/93 |
| 3,934,060 | 1/1976 | Burt et al. | 427/248.1 |
| 4,010,290 | 3/1977 | Boland | 427/93 |
| 4,016,007 | 5/1977 | Wada et al. | 427/93 |
| 4,140,548 | 2/1979 | Zimmer | 427/93 |
| 4,148,931 | 5/1979 | Reuschel et al. | 427/248.1 |

OTHER PUBLICATIONS

Klerer, J. Electrochem. Soc., Nov. 1961, pp. 1070–1071, vol. 108(11).
Rosler, Solid State Tech., Apr. 1977, pp. 63–70.
Bryant, Thin Solid Films, 1979, pp. 19–25, vol. 60.
Cowher et al., J. Electrochem Soc., No. 119, 1565 (1972).
Vassen et al., J. Vacuum Sci. and Technology, 11, 60 (1979).

*Primary Examiner*—Michael R. Lusignan
*Assistant Examiner*—Richard Bueker
*Attorney, Agent, or Firm*—Bruce S. Schneider

[57] ABSTRACT

The efficient production of sequential layers of silicon dioxide and polycrystalline silicon is possible using a specific set of reaction steps. This set of reaction steps includes the oxidation of silicon at low oxygen pressure and at temperatures of the magnitude of 900 degrees C., followed by the deposition of polycrystalline silicon at substantially the same temperature utilizing a dichloride silane chemical vapor deposition (CVD) process.

9 Claims, 1 Drawing Figure

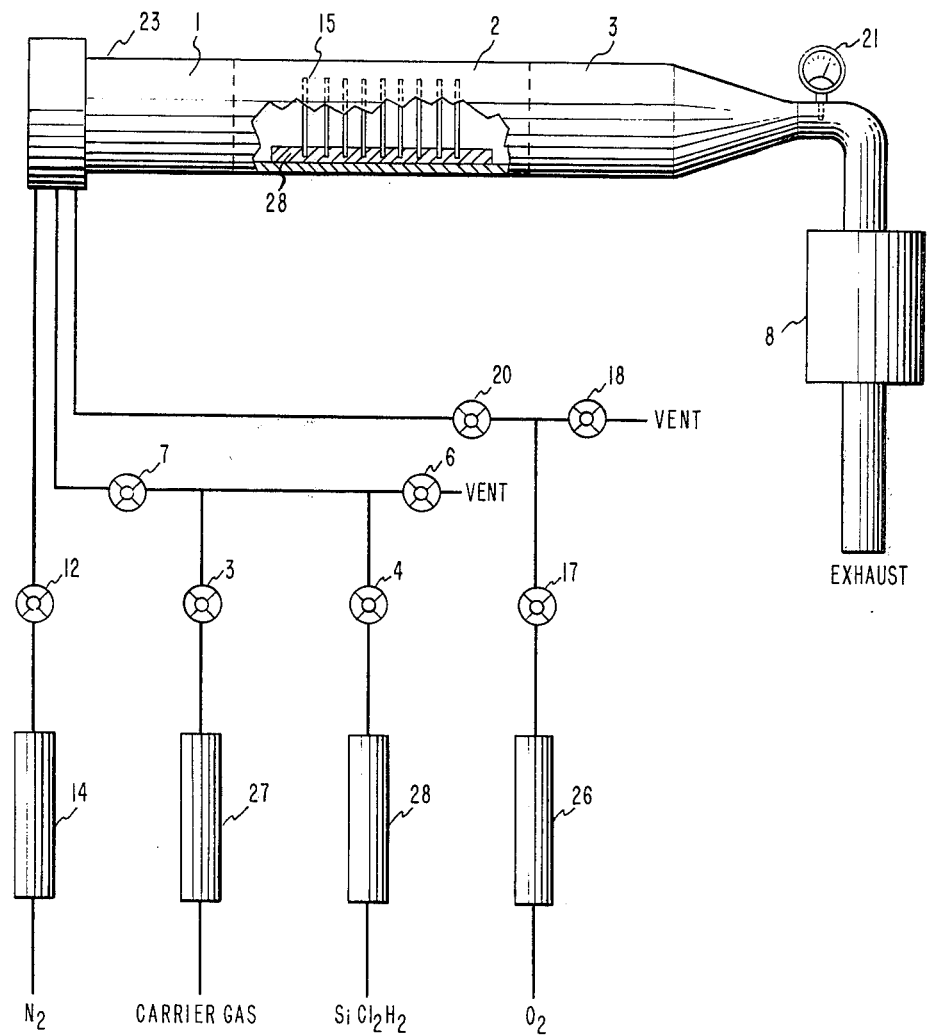

METHOD FOR PRODUCING SILICON DIOXIDE/POLYCRYSTALLINE SILICON INTERFACES

BACKGROUND OF THE INVENTION

1. Field of the Invention

This invention relates to semiconductor device processing and, more particularly, to the processing of devices containing silicon.

2. Art Background

A major source of silicon device failure results from introduction of contaminants during the fabrication process. This contamination often occurs between fabrication steps when the sample must be transferred from one deposition apparatus to another, or when an apparatus is vented to the atmosphere in order to prepare for a subsequent processing step. During the transfer between equipment or during the period when the equipment is vented, impurities inevitably in the atmosphere contaminate the surface of the sample. These impurities are trapped between device layers upon deposition of subsequently fabricated layers.

The problem of contamination is particularly acute in devices, such as MOS IGFETs and MOS capacitors that contain a silicon dioxide/polycrystalline silicon interface. Generally, the silicon dioxide is formed by oxidizing a silicon substrate. The substrate is then transferred to chemical vapor deposition (CVD) equipment for deposition of polycrystalline silicon from a silane ($SiH_4$) containing reactant mixture. (See, for example, M. E. Cowher and T. O. Sedgwick, *Journal of the Electrochemical Society*, 119, 1565 (1972).) Thus, for devices requiring a silicon dioxide/polycrystalline silicon interface, there is an increased opportunity for device contamination with its associated difficulties.

SUMMARY OF THE INVENTION

The use of a particular series of reaction steps enables the sequential production of a silicon dioxide and polycrystalline silicon layer without the risk of contamination between these layers. These steps include (1) the oxidation of a silicon surface at reduced pressures to form a silicon dioxide layer followed by (2) the deposition of polycrystalline silicon (polysilicon) by chemical vapor deposition (CVD) utilizing a reactant gas including $SiCl_2H_2$ at substantially the same temperature as utilized in the previous oxidation step. Devices such as MOS capacitors are advantageously made by this procedure.

BRIEF DESCRIPTION OF THE DRAWING

The FIGURE is a schematic representation of an apparatus useful for practicing the subject invention.

DETAILED DESCRIPTION

In a preferred embodiment, the process of the subject invention is performed in a hot-walled furnace, i.e., a furnace whose temperatures at the walls is substantially the same as the temperature at the sample that is undergoing processing. The silicon samples to be oxidized are cleaned by conventional techniques such as acid etching. These samples, 15, are then loaded into the furnace, 23. The orientation of the samples is not critical and typically for space reasons they are aligned parallel to one another and perpendicularly to the rotational axis of the furnace. Generally an inert atmosphere such as a nitrogen atmosphere is maintained in the furnace during loading to prevent unnecessary contamination of the silicon surface.

The furnace is then evacuated, typically to a pressure less than 0.002 Torr. This evacuation is done as an expedient to insure the control of the oxygen partial pressure during the oxidation step. In this regard, after the chamber is evacuated, oxygen is introduced to initiate the oxidation process. Typically, oxygen partial pressures in the range 0.2 to 10 Torr are utilized. Pressures less than 0.2 Torr are not preferred since oxidation rates are unacceptably slow for most practical applications. Higher pressures are not desirable since they induce a rapid oxidation. For this oxidation process the oxidation rate with time is parabolic. Thus, for a rate greater than about 3 Angstroms$^2$/sec., the thickness of the thin oxides used in most common devices is not adequately controlled. This lack of control produces oxide layers which are inappropriate for most device purposes.

During the oxidation procedure, temperatures in the furnace, and also at the sample, since it is a hot-wall furnace, are maintained in the range 900 to 1000 degrees C. The combination of the chosen temperature and oxygen partial pressure determine the rate of oxidation. As explained above, an oxidation rate faster than 3 Angstroms$^2$/sec. is generally not acceptable. Therefore, for partial pressures in the preferred range of 0.2 to 10 Torr, temperatures in the range 900 to 1000 degrees C., preferably 925 to 975 degrees C., are utilized to insure an adequate, but not excessive oxidation rate.

Generally, for temperatures and pressures in the preferred range, oxidation rates in the range 0.1 to 3 Angstroms$^2$/sec. are obtained. The reaction is continued until the desired thickness of silicon dioxide is obtained. For most device applications, silicon dioxide layers having a thickness in the range 50 to 300 Angstroms are required. The thickness is measured by conventional techniques such as by ellipsometry or by measuring the capacitance as a function of voltage for the finished device. Thus, for typical reaction rates suitable thicknesses are produced when the oxidation procedure continues for time periods in the range 1 to 8 hours. During oxidation, it is desirable to maintain a stable temperature and oxygen partial pressure. Generally, variations in temperature or partial pressures greater than ±5 degrees C. and ±0.1 Torr, respectively, produce unacceptable variations in the quality of the silicon dioxide layer and should be avoided.

After the oxidation is completed, the oxygen is evacuated. However, the temperature used during the oxidation procedure is maintained at substantially the same level, i.e., is kept at a level within 1 percent of that used for the oxidation procedure. Dichlorosilane ($SiCl_2H_2$) is then introduced into the reaction furnace. (The silicon dioxide layers are kept in a protective environment that is designed to prevent contamination before the $SiCl_2H_2$ is introduced. For example, a low pressure is maintained in the reaction chamber.) The $SiCl_2H_2$ is introduced alone or with a carrier gas. It is possible to use an inert carrier gas, such as helium or nitrogen, or, alternatively, a carrier gas such as hydrogen. The carrier gas, however, should not be an oxidant, since this would interfere with the desired reaction.

Partial pressures of dichlorosilane in the range 0.05 to 0.3 Torr are advantageously utilized. Partial pressures less than 0.05 Torr are not generally acceptable because the rate of polysilicon formation is unacceptably low. Partial pressures above 0.3 Torr are also not advantageous since at these pressures undesirable gas phase reaction can occur. It is possible to add carrier gases to the dichlorosilane so that gas phase reactions are further suppressed. When carrier gases such as nitrogen, helium, or hydrogen are utilized, total gas pressures in the range 0.2 to 0.5 Torr are employed. Generally, from 0 to 80 percent of the total gas mixture is composed of the carrier gas.

Temperatures in the range 800 to 1000 degrees C. induce the formation of polysilicon. However, as discussed earlier, to obtain the full benefit of the invention, the temperature employed for the deposition of polysilicon should be substantially the same, i.e., within 1 percent of the temperature employed for the oxidation of the silicon into silicon dioxide. In fact, a substantial advantage of the subject process is that the successive layers of silicon dioxide and polycrystalline silicon are producible without the transfer of the sample between different equipment and without the substantial altering of reaction conditions. It has been found that by maintaining the temperature and by keeping the silicon dioxide protected between growth of the silicon dioxide and growth of the polysilicon, improved devices are obtained through a reduction in surface contamination and defects.

Typical deposition rates for the polycrystalline silicon within the preferred reaction conditions are between 75 and 300 Angstroms per minute. Since, generally, polycrystalline silicon layers in most devices have a thickness in the range 2000 to 6000 Angstroms, typical deposition times are in the range 15 to 60 minutes. If the polycrystalline silicon is thinner than 2000 Angstroms, excessive sheet resistance is usually encountered. If the thickness is greater than 6000 Angstroms, then step heights in the device generally are too large for metal coverage in subsequent fabrication steps.

After the deposition of polysilicon is completed, the apparatus is evacuated and backfilled with an inert gas such as nitrogen. The samples are then unloaded for conventional processing necessary to produce a device. For example, the resistivity of the polycrystalline silicon layer is typically lowered so that it does not produce excessive power requirements in the device in which it is incorporated. Generally, the resistivity is reduced by doping. In a preferred method, this is achieved by placing the samples in a dopant atmosphere at temperatures in the range 900 to 1000 degrees C. for time periods in the range 15 to 60 minutes. Conventional dopants such as $PBr_3$ or $POCl_3$ are utilized. A control sample is employed to determine the precise time and temperature required to produce a desired resistivity. Generally, resistivities in the range $5-20 \times 10^{-4}$ ohm-cm are desirable. To achieve resistivities in this range, with exemplary dopants such as $PBr_3$ or $POCl_3$, temperatures in the range 950 to 1000 degrees C., and treatment times of between 15 and 30 minutes are utilized.

In a preferred embodiment, the silicon dioxide/polysilicon structure is grown on a silicon substrate already having means for electrical contact. Such electrical contacts are easily made by conventional techniques such as evaporation of a metal onto the silicon. (See J. L. Vossen et al, *Journal of Vacuum Science and Technology,* 11, 60 (1974).)

The following examples illustrate the reaction conditions useful in the subject invention and the improvement in results as compared to other methods that do not reduce surface contamination:

EXAMPLE 1

A p-type silicon wafer having a resistivity in the range 1 to 10 ohm-cm was cut along the 100 crystal plane from a boule having a 75 mm diameter. The wafer was cleaned with a 1:1:4 mixture of HCl, $H_2O_2$, and water. Further cleaning was done by using a 1:1:4 solution of $NH_4OH$, $H_2O_2$, and water followed sequentially by a treatment of dilute hydrofluoric (HF) acid (100 parts water to 1 part concentrated HF) and a rinse in deionized water. The samples were then spun dry.

The furnace was heated to a uniform temperature of approximately 953 degrees C. This was done by initially producing a temperature of 968 degrees C. in heating zones 1 and 3, (in the FIGURE) together with a temperature of 953 in heating zone 2. (Losses at the furnace extremities produced a uniform temperature.) Valve 12 was then opened allowing the furnace to fill with nitrogen from tank 14. Eight samples were put in sample holder 28, so that their major surface was perpendicular to the plane of the sample holder. The sample holder was then inserted into zone 2 of the furnace. Valve 12 was closed and vacuum pump 8 was utilized to evacuate the furnace to a pressure of less than 0.002 Torr. Valves 17 and 18 were opened to begin an oxygen flow from tank 26. Then valve 18 was closed, valve 20 was opened, and the oxygen flow was adjusted to produce a pressure of 1 Torr as indicated on pressure gauge, 21. After 8 hours, the oxygen flow was stopped and the system was evacuated to less than 0.002 Torr using pump 8. Heating was discontinued and nitrogen was introduced using valve 12. After cooling, the samples were removed from the furnace. The oxide layers were determined to be between 69 and 73 Angstroms thick by ellipsometry.

Aluminum was then evaporated onto the silicon dioxide layer to a thickness of approximately 7000 Angstroms. (This was done utilizing a vacuum evaporation apparatus.) Standard photolithography and etching were used to define 800 dots, 30 mil in diameter, over the surface of the silicon dioxide.

Measurements of breakdown voltage for 200 capacitors formed between the aluminum dots and the silicon substrate showed breakdown fields in the range 10 to 13 MV/cm.

EXAMPLE 2

The procedure of Example 1 was followed except a temperature of 1000 degrees C. was utilized in the furnace for a period of 1.5 hours to produce an oxide thickness of approximately 1000 Angstroms. The samples were removed from the furnace and then reinserted after the furnace temperature was adjusted to 900 degrees C. and filled with nitrogen. After inserting the samples, the furnace was then evacuated to a pressure less than 0.002 Torr using pump 8. Valves 3 and 4 were opened to initiate flows of $N_2$ and $SiCl_2H_2$ from tanks 27 and 28, respectively, and adjusted while valve 6 was opened to produce a mixture of 62 percent dichlorosilane and 38 percent nitrogen. Valve 6 was then closed, valve 7 opened, and the pressure adjusted to 0.3 Torr with valve 7. After 30 minutes of treatment, valve 7 was closed and the system was evacuated to less than 0.002 Torr. Heating was discontinued and the deposition area was filled with nitrogen through valve 12. The samples were removed when the temperature reached approximately room temperature.

The polysilicon layer thus produced was approximately 8500 Angstroms thick which indicated a deposition rate of approximately 285 Angstroms per minute. The polysilicon layers were then doped by placing the wafers in a 1:1:18 mixture of $POCl_3$, $O_2$ and $N_2$ at 1000 degrees C. for 25 minutes. The resistivity of the polysilicon layer after this doping treatment was approximately $8 \times 10^{-4}$ ohms-cm. The polysilicon layer was formed into dots as described in Example 1. The breakdown voltage measured for the capacitors thus formed were in the range 7 to 11 MV/cm.

The procedure described above was repeated using dichlorosilane with either helium or hydrogen instead of nitrogen. (Substantially the same total pressure and composition was used.) The deposition rate for the helium and hydrogen containing mixture respectively was 278 and 298 Angstroms per minute. The resistivities after doping were in the range 5 to $9 \times 10^{-4}$ ohms/cm. After dots were formed for each of these two sample runs, breakdown voltages in the range 7 to 10 for helium and hydrogen were obtained.

EXAMPLE 3

The procedure of Example 2 utilizing a 62 percent mixture of dichlorosilane and nitrogen was followed. However, a temperature of 800 and 850 degrees C. in two separate experimental runs were utilized instead of the 900 degrees C. temperature. The resistivities of the polysilicon layer after doping were substantially the same as obtained in Example 2. The deposition rates at 800 and 850 degrees C. were in the range 150 to 175 and 75 to 83 Angstroms per minute respectively. Breakdown voltages for the 800 and 850 degree C. samples were in the range 6 to 11.

EXAMPLE 4

The procedure of Example 2 was followed except the samples were not removed from the furnace between the oxidation and polysilicon deposition step. The furnace temperature used for the oxidation step was 950 degrees C. An oxygen pressure of 2 Torr was utilized for 6 hours. After the oxidation, the system was evacuated to approximately 0.002 Torr. The temperature was maintained during the evacuation procedure and a mixture of 33 percent dichlorosilane in 67 percent nitrogen at a total pressure of 0.3 Torr was introduced into the furnace as described in Example 2. The deposition of polysilicon was continued at 950 degrees C. for 20 minutes to yield a thickness of approximately 4800 Angstroms. The samples were doped utilizing a 1:1:18 ratio of $PBr_3:O_2:N_2$ mixture at 950 degrees C. for 20 minutes. The resistivities of the polysilicon layer thus obtained were $16 \times 10^{-4}$ ohms-cm. Dots were formed on the polysilicon as previously described. Capacitance voltage measurements indicated an oxide thickness of 155 Angstroms with breakdown fields in the range 11 to 14 MV/cm.

We claim:

1. A process for producing a body comprising a region of silicon dioxide in intimate contact with a region of polycrystalline silicon wherein said body is suitable for a semiconductor device application, said process comprising the steps of oxidizing silicon in said body to produce said region of silicon dioxide and depositing said region of polycrystalline silicon on said region of silicon dioxide characterized in that said silicon is oxidized in oxygen at a partial pressure in the range 0.2 to 10 Torr and at an oxidation temperature in the range 900 to 1000 degrees C., said oxygen is removed after oxidation while maintaining a protected environment, and said deposition of polycrystalline silicon is performed utilizing a reactant mixture comprising dichlorosilane wherein said reactant mixture is subjected to a temperature within 1 percent of said oxidation temperature to produce said region of silicon dioxide and wherein said region of polycrystalline silicon is deposited.

2. The process of claim 1 wherein said oxidation temperature is in the range 925 to 975 degrees C.

3. The process of claim 1 wherein said reactant mixture includes a carrier gas.

4. The process of claim 3 wherein said carrier gas is chosen from the group consisting of nitrogen, helium and hydrogen.

5. The process of claim 3 wherein said inert gas is less than 80 percent of the reactant mixture.

6. The process of claim 1 wherein said dichlorosilane is used at a partial pressure in the range 0.05 to 0.3 Torr.

7. The process of claim 1 wherein said region of polycrystalline silicon has thickness in the range 2000 to 6000 Angstroms.

8. The process of claim 1 including the step of doping said polycrystalline silicon region.

9. The process of claim 1 wherein said silicon dioxide structure is grown on a substrate comprising silicon.

* * * * *